US005400741A

United States Patent [19]

DeTitta et al.

[11] Patent Number: 5,400,741

[45] Date of Patent: Mar. 28, 1995

[54] DEVICE FOR GROWING CRYSTALS

[75] Inventors: George T. DeTitta; Joseph R. Luft, both of Kenmore, N.Y.

[73] Assignee: Medical Foundation of Buffalo, Inc., Buffalo, N.Y.

[21] Appl. No.: 65,813

[22] Filed: May 21, 1993

[51] Int. Cl.[6] ............................................ B01D 9/02

[52] U.S. Cl. .................................... 117/206; 117/200; 117/201; 422/102

[58] Field of Search ............... 156/600, 621, DIG. 62, 156/DIG. 89, DIG. 90, DIG. 93; 422/102, 245

[56] References Cited

U.S. PATENT DOCUMENTS

| | | | |
|---|---|---|---|
| 4,886,646 | 12/1989 | Carter et al. | 156/600 |
| 5,078,975 | 1/1992 | Rhodes et al. | 156/DIG. 62 |
| 5,096,676 | 3/1992 | McPherson et al. | 422/245 |
| 5,130,105 | 7/1992 | Carter et al. | 156/600 |
| 5,221,410 | 6/1993 | Kushner et al. | 156/600 |
| 5,266,284 | 11/1993 | Heilig et al. | 156/DIG. 62 |

*Primary Examiner*—R. Bruce Breneman
*Assistant Examiner*—Felisa Garrett
*Attorney, Agent, or Firm*—Hodgson, Russ, Andrews, Woods & Goodyear

[57] ABSTRACT

A varisized diffusion cell device (10) comprising a plurality of diffusion cells (18) arranged in rows (20A) to (20F) having progressively greater depths for growing high quality, diffraction grade crystals, is described. In use, the diffusion cells receive a quantity of crystallizing agent (32) that dissolves and diffuses through a head of solvent solution (34) to equilibrate with a drop (38) containing a subject macro-molecular material for growing crystals. The various depths of the diffusion cells provide various diffusion rates and therefore various equilibration rates. Through empirical methods, an optimum diffusion rate for a given crystal growth system can easily be determined.

17 Claims, 4 Drawing Sheets

DEVICE FOR GROWING CRYSTALS

FIELD OF THE INVENTION

The present invention relates generally to a device for growing crystals, and more particularly, to a device for growing high quality, diffraction grade crystals by various equilibration techniques.

Crystallography is the study of crystals, including their forms, their structure and their patterns of growth. As such, crystallography is a poweful analytical tool that provides precise and detailed structural descriptions of molecules. However, only those crystals that can be easily grown in sufficient number have been studied thoroughly enough to determine their structural composition. If crystal growth could be made reliable and more easily executed, material that is more difficult to obtain or crystallize can also be studied. The problem is that crystal growth is dependent upon a large number of variables, a few of which include the temperature of the solvent solution in the growth reservoir, the concentration of the crystallizing agent in the solvent solution, the pH of the solvent solution and the rate of equilibration of the crystallizating agent. The equilibration rate, one of the more critical parameters, is the rate of equilibration between a drop of solution containing the subject material, crystals of which are desired, and the surface of the reservoir. In that respect, the present invention is directed to a device comprising a plurality of varisized diffusion cells serving as crystal growth reservoirs that enable a chemist or lab technician to simultaneously perform a large number of crystallization growth experiments at various equilibration rates to thereby enable through empirical methods determination of the optimum equilibration rate for a given crystal growth system.

One of the best known methods for growing crystals of macro-molecular material is referred to as the "hanging drop" technique. In this technique, a solution of a crystallizing agent, such as for example, ammonium sulfate or polyethylene glycol, in a concentration of about 40% of saturation solution is filled into a dry reservoir. As the name of this technique suggests, a drop containing a homogenous mixture of the subject macro-molecular material and crystallizing agent in solution is suspended over the reservoir as a sealed system. The concentration of crystallizing agent in the drop is less than necessary to effect crystallization of the macro-molecular material while the concentration in the reservoir is higher than necessary to effect crystallization. Over time, the concentration of the crystallizing agent in the drop equilibrates with the surface concentration of the reservoir, principally through evaporation of the drop. As equilibration progresses, a crystal of the macro-molecular material grows where the drop originally hung.

The problem is that it is difficult to regulate the equilibration rate between the drop and the reservoir in such a "static" system to a degree that is optimum for growth of high quality, diffraction grade crystals. Depending on the concentration of the reservoir solution, equilibration can take place too slowly or too quickly for a particular crystal growth system. The resulting crystal will then be of poor quality or will not grow at all. The drop containing the macro-molecular material should equilibate with the reservoir at a steady and even rate that is normally determined only through trial and error experimentation for a given crystal growth system.

Thus, the present invention provides a device that is useful for performing crystal growth experiments at various equilibration rates to enable, through empirical methods, determination of a equilibration rate for a particular crystal growth system that results in optimum crystal formation of the subject macro-molecular material. Since the desired equilibration rate is difficult to determine before hand, the present invention provides a plurality of varisized diffusion cells serving as reservoirs for performing crystal growth experiments. Other parameters being equal, the varisized equilibration cells of the present invention enables a chemist or technician to run a series of crystal growth experiments at various diffusion rates and through empirical observation, select an equilibration rate i.e., diffusion cell depth, that provides for optimum crystal growth for a subject macro-molecular material. Once the optimum equilibration rate is determined, that rate can then be replicated to build an abundant quantity of high quality, diffraction grade crystals for use in crystallographic analyses.

Prior Art

In addition to the "hanging drop" technique previously discussed, several other methods have been practiced extensively. Among these is the "sitting drop" technique. The general concept of equilibrating a drop of macro-molecular solution and crystallizing agent with a sealed reservoir containing a higher concentration of crystallizing agent in solution than is necessry to effect crystallization in the drop remains the same. However, in this technique, the drop is placed in an open ended depression that is positioned above and in communication with the reservoir.

Such a device for practicing this technique is shown in U.S. Pat. No. 5,096,676 to McPherson et al, which describes an apparatus having a plurality of cylindrically shaped equilibrating reservoirs, each having similarly sized circular cross-sections and depths. The reservoirs are provided with upwardly extending columns having a depression for supporting a drop of solution containing the subject macro-molecular material. A cover is sealed over the individual reservoirs to provide a closed crystal growth system. The large number of crystal growth reservoirs automates the process to a certain extent.

Another embodiment of the sitting drop technique comprises placing the drop in a cup-like device that is supported above and in communication with the sealed reservoir by a screen. Equilibration then occurs by evaporation of the drop. Still another method for growing crystals comprises placing the drop in the cup-like device covered with a semi-permeable membrane. The equilibrating reservoir fluid is filled above the cup-like device and equlibration takes place by diffusion through the membrane. In all these prior art techniques, the problem of tailoring the equilibration rate to an optimum degree for a particular crystal growth system remains.

The present invention solves this problem by providing a device having a plurality of varisized diffusion cells serving as reservoirs for performing crystal growth experiments at various equilibration rates. In a given crystal growth experiment, keeping all parameters equal except diffusion cell depth enables the chemist or lab technician to carefully monitor which equilibration rate, i.e., diffusion cell depth, leads to the highest quality crystal growth. Then, a large number of additional crystal growth experiments can be performed at the desired equilibration rate to grow an abundance of high quality, diffraction grade crystals. Thus, the varisized diffusion cells of the present invention provide a device that is useful for ready determination of an optimum equlibiration rate for a given crystallization growth system and that can be adapted for use with any one of the tradition crystal growth techniques including the hanging drop technique, the sitting drop technique and the micro-dialysis technique.

OBJECTS

It is therefore an object, of the present invention to provide a new and useful device for growing high quality, diffraction grade crystals.

Further, it is an object of the present invention to provide a device that enables crystal growth experiments to be run at various equilibration rates to readily determine which rate is optimum for growth of high quality, diffraction grade crystals for a particular macro-molecular material.

Furthermore, it is an object of the present invention to provide a device that enables crystal growth experiments to be run at various equilibration rates using any one of the traditional techniques to readily determine an optimum diffusion rate for a crystallizing agent to thereby grow high quality, diffraction grade crystals of a subject macro-molecular material.

Finally, it is an object of the present invention to provide a device for performing a plurality of crystal growth experiments at various equilibration rates and that is inexpensive to manufacture, easy to use and readily compatible with automatic pipetting sample preparation.

These and other objects will become increasingly apparent to those of ordinary skill in the art by reference to the following description and to the drawings.

IN THE DRAWINGS

Figure 3:
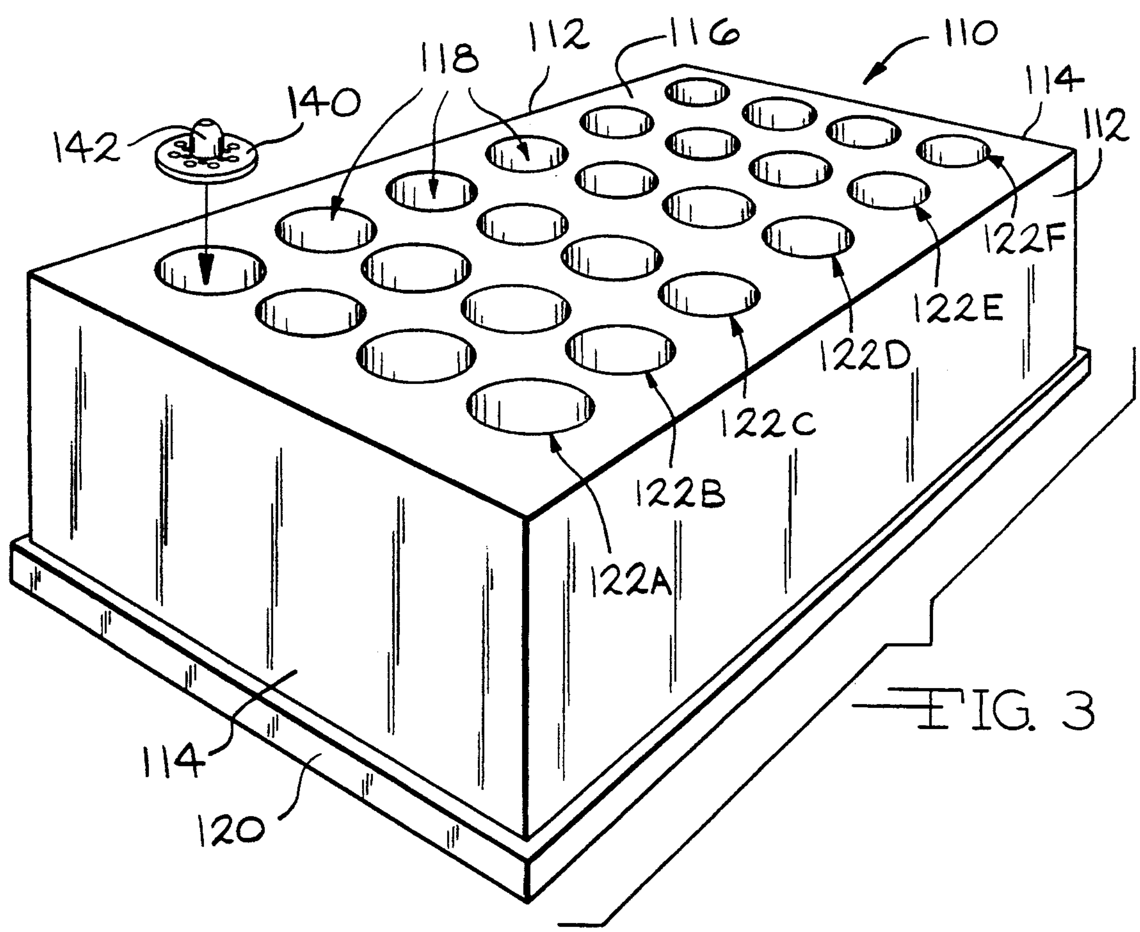
FIG. 3 is a perspective view of another embodiment of a varisized diffusion cell device 110 of the present invention for growing high quality, diffraction grade crystals according to one embodiment of the "sitting drop" technique.
Figure 4:
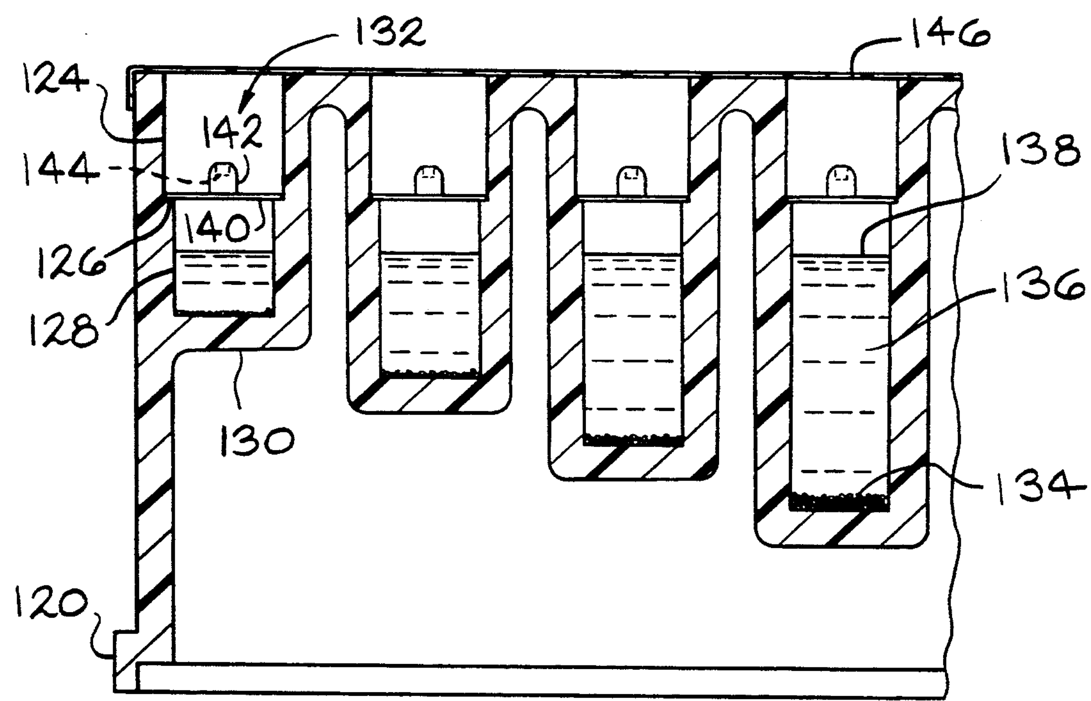

FIG. 4 is a broken, cross-section view of the varisized diffusion cell device 110 shown in FIG. 3 having a plurality of microdialysis buttons 142 supported above an equilibrating solution 134 filled to a uniform level in rows of 120A to 120F of diffusion cells 118 having progressively greater depths.

Figure 5:
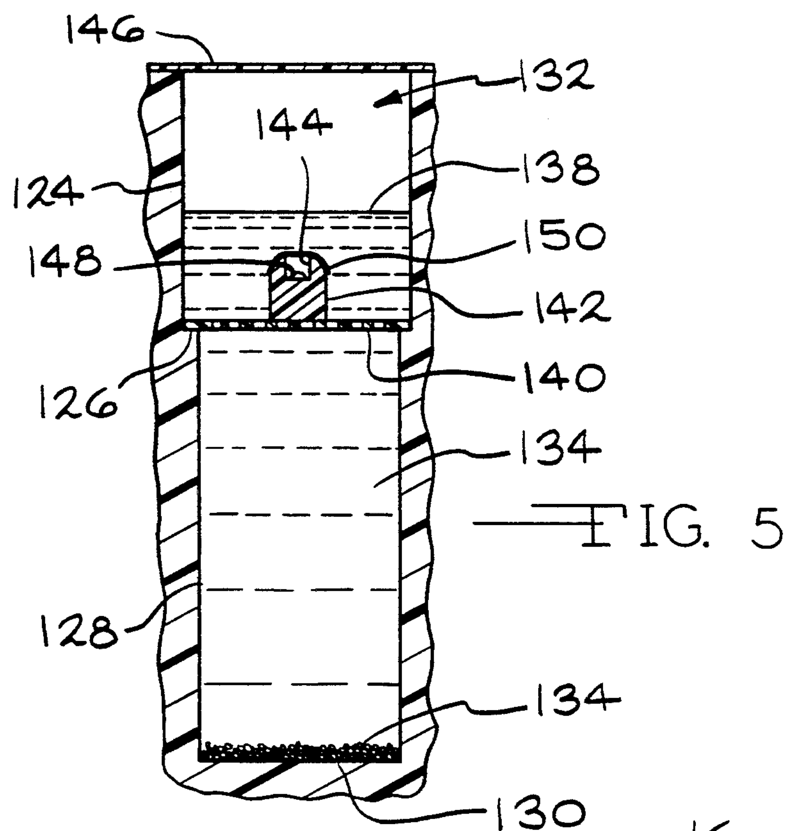

FIG. 5 is an enlarged view of one of the diffusion cells 118 shown in FIG. 4 provided with the microdialysis button 142 supported on a screen 140 and holding a drop 148 containing a macro-molecular material in solution and provided with a semipermeable membrane 150 for osmotic equilibration with solution 134 for growing crystals according to the present invention.

Figure 6:
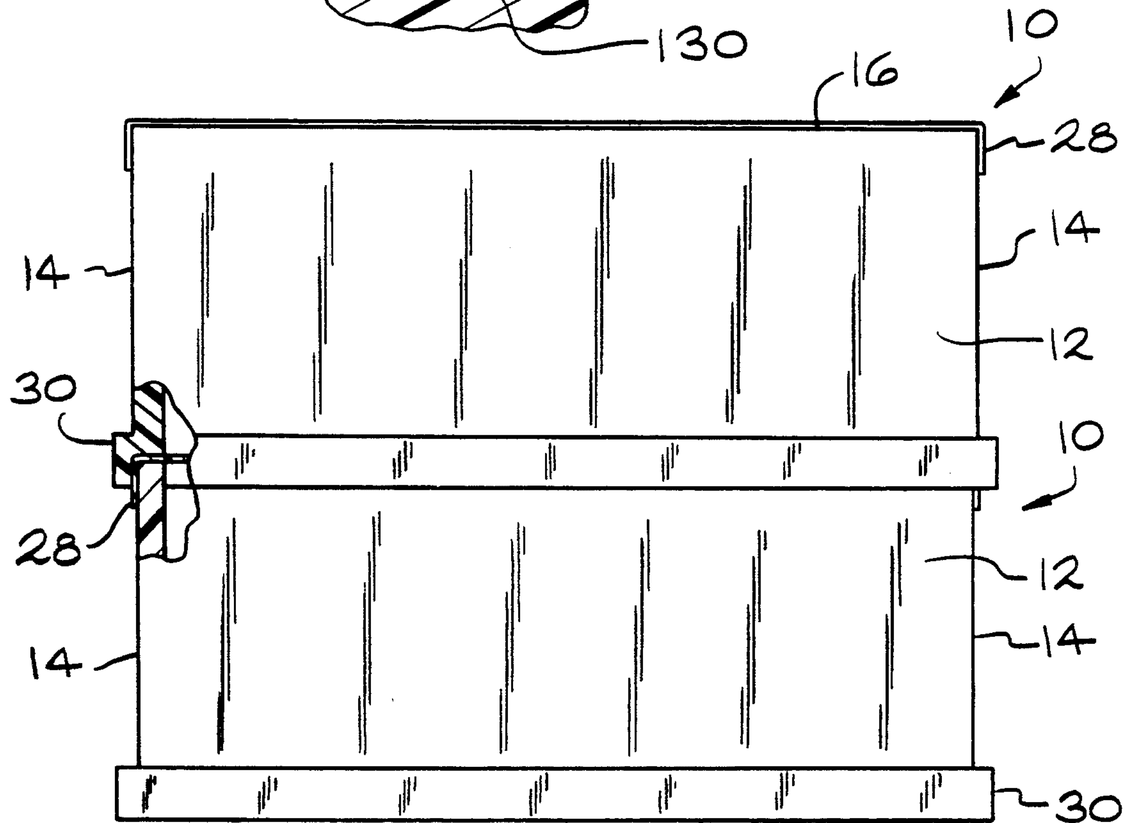

FIG. 6 is a side elevational view, partly in cross-section, of two varisized diffusion cell devices 10 of the present invention stacked one upon the other.

Figure 7:
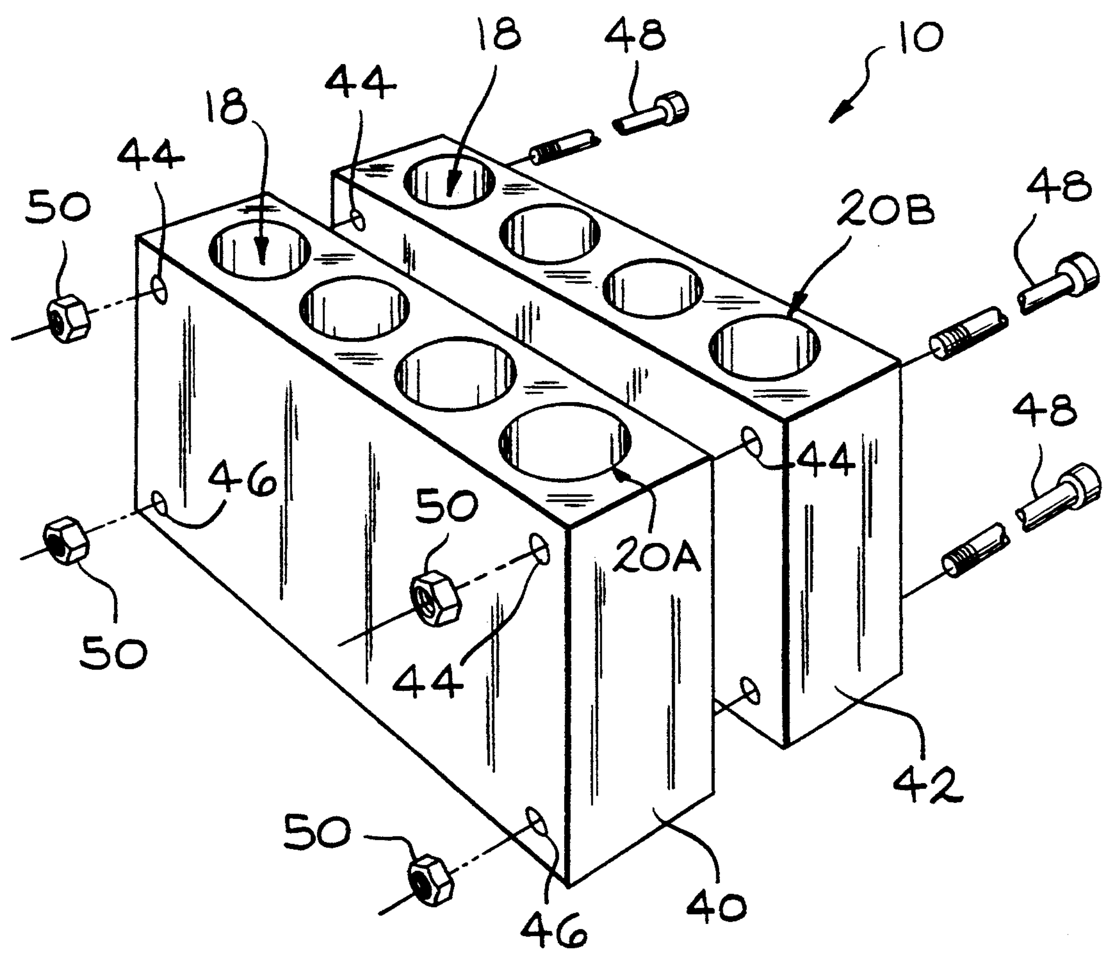

FIG. 7 is a separated perspective view of a verisized diffusion cell device 10 of the present invention wherein the rows 20A and 20B of cells 18 are provided in seperable blocks 40 and 42, respectively.

SPECIFIC DESCRIPTION

Figure 1:
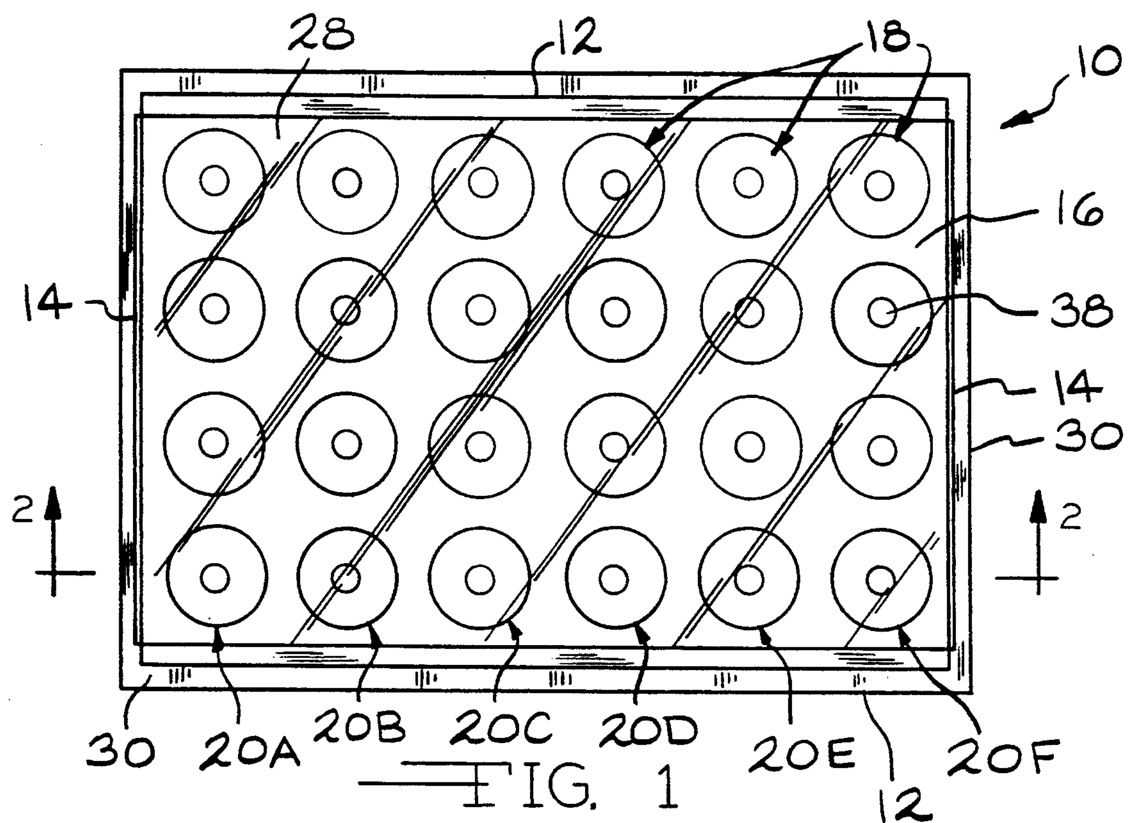
FIG. 1 is a plan view of one embodiment of a varisized diffusion cell device 10 of the present invention for growing high quality, diffraction grade crystals by the "hanging drop" technique.
Figure 2:
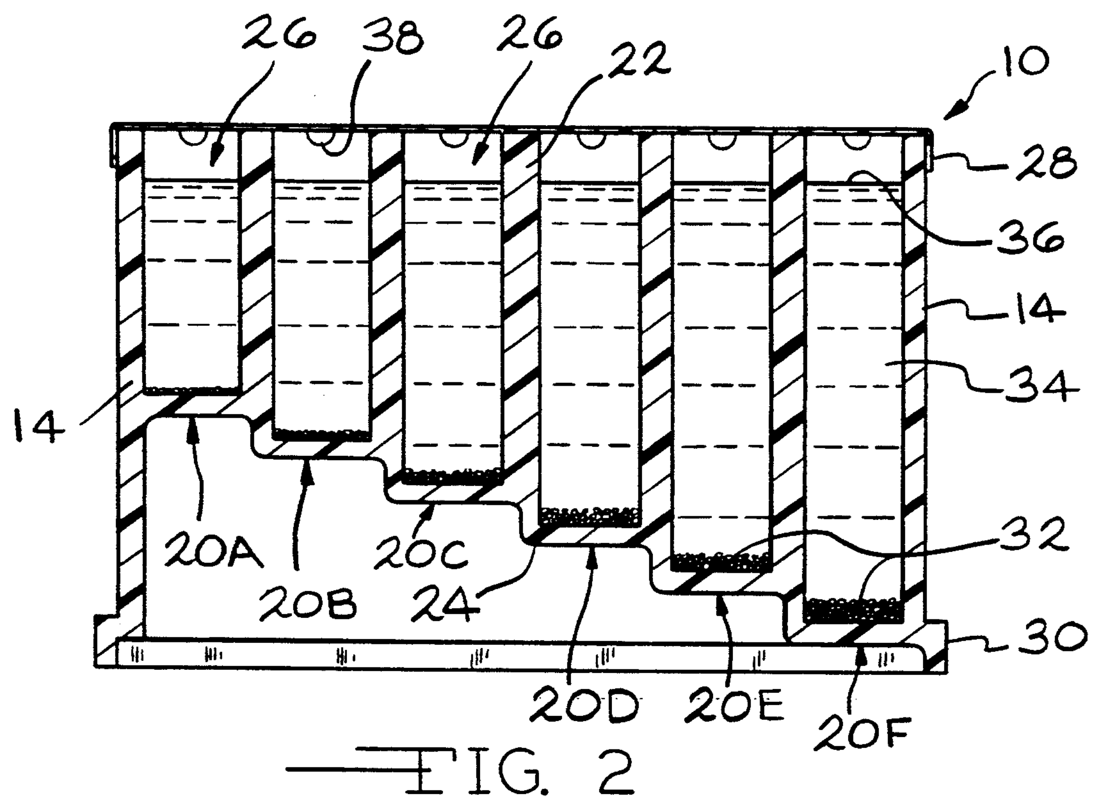
FIG. 2 is a cross-sectional view along line 2—2 of FIG. 1 showing the varisized diffusion cell device 10.

Referring now to the drawings, FIGS. 1, 2 and 6 show one embodiment of a varisized diffusion cell device 10 for growing high quality, diffraction grade crystals (not shown) according to the present invention. In this embodiment, the "hanging drop" technique for growing crystals is illustrated, which will be described in detail presently. Varisized diffusion cell device 10 comprises spaced apart side walls 12 joining with spaced apart end walls 14 that together extend to and meet with an upper wall 16 supporting a plurality of equilibrating diffusion receptacles or cells 18 serving as reservoirs. There are preferably four (4) columns of diffusion cells 18 arranged in six (6) rows indicated as rows 20A, 20B, 20C, 20D, 20E, and 20F, wherein each successive row has a progressively greater depth than the previous row.

As shown in FIG. 2, the plurality of diffusion cells 18 preferably have a cylindrical shape formed by an annular side wall 22 extending between upper plate 16 and a stair-stepped shaped bottom wall 24. A plurality of upper openings 26 through wall 16 lead into the respective diffusion cells 18 such that the upper edges of the diffusion cells 18 are coplanar with the upper surface of plate 16. Annular side walls 22 forming the respective rows 20A to 20F of diffusion cells 18 have progressively decreasing lengths along each column from the deepest row 20F to the shallowest row 20A. This provides the diffusion cells 18 comprising the respective columns with depths, chosen to decrease an amount based on a percentage of the next greater depth. By way of example and not meant to be limiting, if the cells 18 in the deepest row 20F are chosen to be 3.75 inches deep, the depth of the cells 18 in the next shallowest row 20E are 3.56 inches deep, calculated as the square root of 90% of the square of the depth of the cells 18 in row 20F. Using similar calculations, the cells 18 in row 20D are 3.38 inches deep, those in row 20C are 3.21 inches deep, those in row 20B are 3.04 inches deep and those in row 20A are 2.89 inches deep. Preferably, the diffusion cells 18 comprising each row are of similar depth.

A thin pliable cover 28 having an adhesive material on the lower surface thereof, is movable into sealable engagement with upper wall 16 and thereby into sealable engagement with the openings 26 leading into the plurality of equilibrating diffusion cells 18. With cover 28 in position (FIG. 1), each of the equilibrating diffusion cells 18 is effectively sealed with respect to atmosphere. Cover 28 can be constructed of any suitable thin plastic or glass material and is preferably made of a polyethylene terephthalate material sold by DuPont under the tradename MYLAR and having an adhesive on the lower side thereof. A very thin glass such as a microscope coverslip (not shown) that is sealed over the cells 18 with grease also works well.

The varisized diffusion cell device 10 of the present invention, comprising the side and end walls 12 and 14, upper wall 16 and the plurality of equilibrating diffusion cells 18 are preferably formed by an injection molding process made from a clear moldable plastic such as polystyrene. Other moldable materials can be used but an optically clear, non-wetting plastic that provides the inner surfaces of the cells 18 with a smooth texture is highly desirable, as will be described in detail presently.

As shown in FIGS. 12, and 6, the varisized diffusion cell device 10 of the present invention, is provided with a peripheral lower flange 30 depending from the outer surface of the side and end walls 12 and 14 to a position below the lower edge thereof. As particularly shown in FIG. 6, flange 30 enables a plurality of diffusion cell devices 10 to be stacked one upon another with the upper wall 16 of a lower device 10 fitted inside the flange 30 of the next above diffusion cell device 10. This is useful for storing the diffusion cell devices 10 during shipping and during the course of a crystallization experiment and helps in handling the diffusion cell devices 10 of the present invention during pipetting and crystal analysis steps, as will be explained in detail presently.

In use, a measured quantity of a crystallizing agent 32, such as ammonium sulfate is placed in each of the diffusion cells 18, resting on the bottom wall 24 thereof. Typically, the quantity of crystallizing agent 32 is sufficient to provide a relatively high concentration i.e., 40% to 60%, when dissolved in a solvent solution 34, such as distilled water. The diffusion cells 18 are then filled with the solvent solution 34, being careful not to create turbulence that may prematurely dissolve the crystallizing agent 32. This can be done by filling each diffusion cell 18 using a graduated pipette and having the solution 34 gently drain against the inner surface of the side wall 22 of the diffusion cell 18. As shown in FIG. 2, the volume of solution 34 that is filled into the plurality of diffusion cells 18 comprising a row, is such that the upper surface 36 of the respective solutions 34 are disposed along a second plane, spaced below the first plane formed by the upper edges of the diffusion cells 18 and upper wall 16. The amount of crystallizing agent 32 loaded into each diffusion cell 18 must be of a quantity so as to provide similar concentrations of the crystallizing agent for the respective varisized diffusion cells in rows 20A to 20F. The non-wetting plastic material used to mold the varisized diffusion cell device 10 of the present invention helps prevent the solution 34 from "creeping" up the inner surface of the side walls 22, which thereby helps prevent the formation of a meniscis in cells 18.

Following the filling of the diffusion cells 18 with the crystallizing agent 32 and solvent solution 34, sufficient number of drops 38 corresponding to the number of cells 18 are deposited on the cover 28 before cover 28 is mounted over the diffusion cells 18. Each drop 38 contains a quantity of subject macro-molecular material and the crystallizing agent in solution. Each drop 38 is deposited on the pliable cover 28 at a position corresponding to a point on the cover 28 that will be aligned along the axis of each diffusion cell 18 when the cover 28 is mounted over the diffusion cells 18. One way this is done is by first placing the cover 28 on a template (not shown), adhesive side up. The template has markings corresponding to an axial position aligned along each diffusion cell 18. The plurality of drops 38 are then deposited on cover 28 and cover 28 is carefully and swiftly flipped over and into a position mounted over the diffusion cell 18 openings 26. The adhesive side of cover 28 is then sealed on upper wall 16 to seal each protein drop 38 suspended or "hanging" into its respective diffusion cell 18, segregated from the atmosphere.

Typically, drop 38 comprises about 10 mg/ml of the subject macro-molecular material, which can be a protein, DNA, RNA or other macro-molecular materials and the like, in a buffered salt solution containing the same precipatating agent 32 that was deposited in the respective diffusion cells 18, but at a concentration that is lower than necessary to effect crystallization of the macro-molecular material. For example, solution 34 may contain about 20% to 30% of ammonium sulfate or polyethylene glycol as the crystallizing agent.

The quantity of crystallizing agent 32 in solution 34 in a fully dissolved and completely diffused state is higher than necessary (40% to 60%) to effect crystallization. However, the equilibration mechanism between drop 38 and solution 34 requires that drop 38 evaporate only to the extent necessary to maintain equilibrium between itself and the surface concentration of the crystallizing agent 32. Because the solution 34 was filled into the diffusion cell 18 in a manner so as not to inadvertently dissolve the crystallizing agent 32 any more than necessary, the crystallizing agent 32 slowly dissolves and then diffuses through the entire depth of the solution 34, gradually increasing the surface 36 concentration until this concentration equals the crystallizing agent 32 concentration in a fully dissolved state. In that manner, drop 38 is initially in communication with respect to the surface 36 of the solution 34 having a relatively low surface concentration of crystallizing agent 32. As the crystallizing agent 32 dissolves and diffuses, the surface 36 concentration gradually increases until the surface concentration equals the relative content of the crystallizing agent 34. All the while, drop 38 is attempting to equilibrate with the surface 36 of the solution 34 through evaporation.

Since it is not acutally known what equilibration rate will provide for optimum crystal growth in drop 38, the varisized diffusion cells 18 comprising device 10 provide increasingly slower equilibration rates corresponding to the progressively greater depths of the diffusion cells 18 in rows 20A to 20F, as previously discussed. Thus, through empirical methods such as visual inspection of the resulting crystal growth with the aid of a microscope, an optimum equilibration rate for a particular crystal growth system can be determined. The clear plastic material comprising the equilibration device provides for such visual inspection.

FIG. 7 shows another preferred embodiment of the present invention. The rows 20A to 20F of cell 18 are provided in blocks, wherein only the first two rows 20A and 20B provided in blocks 40 and 42 are shown for purposes of clarity. Blocks 40 and 42 have upper and lower sets of through channels 44 and 46 which receive bolts 48 provided with nuts 50 to hold the blocks 40 and 42 together. Once the optimum equilibration rate is determined, that rate can be replicated to build an abundant quantity of high quality, diffraction grade crystals by unbolting the block related to the optimum cell 18 depth from the other blocks and using the chosen block in a large number of addition crystal growth experiments.

FIGS. 3 to 5 show another embodiment of a varisized diffusion cell device 110 of the present invention. This device 110 is useful for growing high quality, diffraction grade crystals according to one embodiment of the "sitting drop" technique. As shown, diffusion cell device 110 comprises spaced apart side walls 112 joined with spaced apart end wall 114 that together extend to and meet with an upper wall 116 supporting a plurality of equilibrating diffusion receptacles or cells 118 serving as reservoirs. A surrounding lower flange 120 depends from the outer surface of the side and end walls 112 and 114 to a position below the lower edge thereof. Flange 120 provides for stacking a plurality of the varisized diffusion cell device 110, as previously described with respect to diffusion cell device 10 in FIG. 6.

There are preferably four (4) columns of diffusion cells 118 arranged in six (6) rows indicated as rows 122A, 122B, 122C, 122D, 122E and 122F, wherein each successive row increases in depth from the previous row. As shown in FIGS. 4 and 5, the plurality of diffusion cells 118 each preferably have a first cylindrically shaped side wall 124 depending from upper wall 116 to an annular ledge 126 that meets with a second, cylindrically shaped side wall 128 joining with a bottom wall 130. Ledges 126 in the respective diffusion cells 118 are disposed along a second plane, spaced below the first plane formed by the upper edges of the diffusion cells 118 and upper wall 116. An upper opening 132 leads into each of the diffusion cells 118 such that the upper edges of the plurality of the diffusion cells 118 are coplanar with the upper surface of wall 116. As shown in FIGS. 4 and 5, the respective rows of diffusion cells 122A to 122F have progressively shallower depths from the cells 118 in the deepest row 122F to the cells 118 in the shallowest row 122A. Preferably, the depths of the diffusion cells 118 progressively decrease in a manner similar to that described for the rows 20A to 20B of cells shown in FIGS. 1 and 2. Preferably, the diffusion cells 118 comprising each row having similar depths.

In use and in a similar manner as previously described with respect to the varisized diffusion cell device 10 shown in Figs. 1 and 2, the plurality of diffusion cells 118 are provided with a measured quantity of a crystallizing agent 134, such as ammonium sulfate or polyethylene glycol, and a solvent solution 136. The solvent solution 136 is filled in the diffusion cells 118 in a manner so as not to dissolve the crystallizing agent 134 any more than inadvertently necessary with an upper surface 138 of solution 136 disposed along a third plane, spaced below the second plane formed by the plurality of ledges 126 in the diffusion cells 118. The amount of crystallizing agent 134 loaded into each cell 118 is sufficient to provide each cell 118 with a similar concentration upon completely dissolving and diffusing the crystallizing agent 132.

After the crystallizing agent 134 and solvent solution 136 are deposited into the diffusion cell 118, a perforated plate or screen 140 is positioned inside each diffusion cell 118, resting on ledge 126. A cup-shaped button 142 is then supported on the perforated screen 140. Button 142 is provided with drop receptacle 144 (shown in dashed lines in FIG. 4) that in use holds a drop (not shown) of the subject macro-molecular material and the crystallizing agent 134 in solution. Cover 146, which is similar to cover 28 shown in FIGS. 1 and 2, is then sealed over the upper wall 116 and over the openings 130 leading into the diffusion cells 118 to seal each diffusion cell 118 segregated from the atmosphere. The equilibration of the drop with the crystallizing agent 134 in solution 136 in the diffusion cells 118 then proceeds in a manner similar to that which has previously been described in detail with respect to diffusion cells 18 shown in FIGS. 1 and 2.

FIG. 5 shows another method of using the varisized diffusion cell device 110 of the present invention. In use, the crystallizing agent 134 and solution 136 are filled into the respective diffusion cells 118 in a similar manner as that previously decribed in detail with respect to FIGS. 1 and 4 except that the solution 136 is filled to just below the level of ledge 126. Screen 140 is then supported on ledge 126. The drop 148 of macro-molecular material and crystallizing agent 134 in solution is then deposited inside drop receptacle 144 in the button 142. The button 142 is positioned on the screen 140 supported on ledge 126 and an additional volume of solvent 134 is added to the cells 118 to bring the surface 138 level above the microdialysis button 142, as shown in FIG. 5. Equilibration between solution 134 and drop 148 then proceeds in a similar manner as that previously in detail described with respect to FIGS. 1 and 2 except that the equilibration takes place by osmosis through membrane 150.

In that respect, the crystallizing agent 132 dissolves and diffuses through the depth of the solution 136, gradually increasing the surface 138 concentration until it equals the relative content of the crystallizing agent 134. All the while, drop 148 equilibrates through osmosis with the concentration of solution 136 immediately adjacent membrane 150 to effect the growth of a crystal (not shown) where drop 148 was once positioned. The varisized diffusion cells 118 in rows 120A to 120F thereby provide various equilibration rates that enable a chemist or lab technician to determine through empirical observation, which equilibration rate, i.e. cell depth, results in the optimum growth of high quality diffraction grade crystals.

It is appreciated that various modifications to the inventive concepts may be apparent to those skilled in the art without departing from the spirit and scope of the present invention.

What is claimed is:

1. A device for growing crystals of a macro-molecular material, which comprises:

a) a plurality of equilibrating receptacle means, each having a continuous bottom wall and a surrounding side wall extending upwardly from a peripheral edge of the bottom wall to a top edge thereof, wherein each of the surrounding side walls comprising the plurality of receptacle means have different lengths to provide the plurality of receptacle means with calculated progression depths; and b) cover means provided for sealing engagement with the top edge of the side walls comprising the receptacle means for sealing the receptacle means, wherein the cover means further serves as a drop-supporting means provided for supporting a drop containing a concentration of the macro-molecular material disposed within each of the plurality of receptacle means and wherein each drop is supported by the drop supporting means in communication only with the particular receptacle means within which the drop supporting means is disposed.

2. The device of claim 1 wherein the plurality of receptacle means have circular shaped cross-sections along and around a longitudinal axis of the receptacle means.

3. The device of claim 1 wherein the plurality of receptacle means provide the calculated progression decreasing from a first receptacle means having a first depth greater than a next receptacle means having a progressively shallower depth.

4. The device of claim 3 wherein the calculated progression of depths of the plurality of receptacle means is such that the next receptacle means is calculated as the square root of a percentage of the square of the first receptacle means.

5. The device of claim 1 wherein the cover means comprises a thin sheet of transparent material provided with an adhesive to provide the sealing engagement with the top edge of the side walls comprising the plurality of receptacle means.

6. A device for growing crystals of a macro-molecular material at different growth rates for a crystal growth system, which comprises:

a) a plurality of equilibrating receptacle means, each having a surrounding side wall extending upwardly from a bottom wall to a top edge thereof, wherein the plurality of top edges of the receptacle means are disposed in a first plane with each of the surrounding side walls of the plurality of receptacle means having different lengths to provide the plurality of receptacle means having different depths;

b) drop supporting means provided for supporting a drop containing a concentration of the macro-molecular material disposed within each of the plurality of receptacle means, wherein the drop supporting means comprises a support member and a holder means, the holder means having a cavity for holding the drop containing the macro-molecular material and the support member being provided inside each of the plurality of receptacle means with the support means serving to support the holder means such that the cavity of each of the plurality of holder means are disposed along a second plane intermediate the first plane and the bottom wall of the receptacle means, and in equilibrating communication with the receptacle means and wherein the bottom wall of each of the plurality of variable depth receptacle means are adapted to support a crystallizing agent spaced at different distances from the respective holder means relative to the different depths of the receptacle means such that the quantity of crystallizing agent placed in the plurality of receptacle means is proportional to the different depths to provide the receptacle means with similar concentrations of the crystallizing agent fully dissolved in a solvent solution filled to a similar level in the receptacle means disposed along a third plane intermediate the second plane and the bottom wall of the receptacle means; and c) cover means provided for sealing engagement with the top edge of the side walls comprising the plurality of variable depth receptacle means for sealing the receptacle means with each drop supporting means in communication only with the receptacle means within which the drop supporting means is disposed, wherein the receptacle means can be filled with a variable quantity of solvent solution to the level of the third plane with the crystallizing agent initially remaining undissolved in the solvent solution and wherein the plurality of variable depth receptacle means correspond to different rates at which the crystals can be grown from the macro-molecular material as the crystallizing agent placed on the bottom wall of each of the variable depth receptacle means dissolve and diffuse through the variable quantity of solvent solution so that for the crystal growth system, an optimum rate can be determinable.

7. The device of claim 6 wherein the plurality of receptacle means have circular shaped cross-sections along and around an axis of the receptacle means.

8. The device of claim 6 wherein the plurality of receptacle means provide different depths decreasing in a calculated progression from a first receptacle means having a first depth greater than a next receptacle means having a progressively shallower depth.

9. The device of claim 8 wherein the calculated progression of depths of the plurality of receptacle means is such that the next receptacle means is calculated as the square root of a percentage of the square of the first receptacle means.

10. The device of claim 6 wherein the support member comprises a perforated plate means supported on a ledge provided along the second plane in the plurality of receptacle means.

11. The device of claim 10 wherein the perforated plate means comprises a screen means.

12. The device of claim 6 wherein the cover means comprises a thin sheet of transparent material provided with an adhesive to provide the sealing engagement with the top edge of the side walls comprising the receptacle means.

13. A device for growing crystals of a macro-molecular material, which comprises:

a) a plurality of equilibrating receptacle means, each having a surrounding side wall extending upwardly from a bottom wall to a top edge thereof disposed in a first plane, wherein the surrounding side walls comprising the plurality of receptacle means have a variety of lengths to provide the plurality of receptacle means with a calculated progression of depths; and b) drop-supporting means provided for supporting a drop containing a concentration of macro-molecular material disposed within each of the plurality of receptacle means and wherein the drop supporting means provides a cover means supported on the top edge of the side walls comprising the plurality of receptacle means and in sealing engagement therewith for sealing the receptacle means with each drop supporting means in communication only with the particular receptacle means within which the drop supporting means is disposed.

14. A device for growing crystals of a macro-molecular material, which comprises:

a) a plurality of equilibrating receptacle means, each having a surrounding side wall extending upwardly from a bottom wall to a top edge thereof disposed in a first plane, wherein the surrounding side walls comprising the plurality of receptacle means have different lengths to provide the plurality of receptacle means with a calculated progression of depths;

b) drop-supporting means provided for supporting a drop containing a concentration of macro-molecular material disposed within each of the plurality of receptacle means and comprising a support member provided inside the plurality of receptacle means disposed along a second plane intermediate the first plane and the bottom walls comprising the plurality of receptacle means, the support member adapted to support a holder means having a cavity for holding the drop containing the macro-molecular material and providing for equilibrating communication between the holder means and the bottom wall of the receptacle means, and wherein the support member comprises a perforated plate means supported on a ledge provided along the second plane in the plurality of receptacle means; and c) cover means provided for sealing engagement with the top edge of the side walls comprising the receptacle means for sealing the receptacle means with each drop supporting means in communication only with the particular receptacle means within which the drop supporting means is disposed.

15. The device of claim 14 wherein the perforated plate means is a screen means.

16. A device for growing crystals of a macro-molecular material, which comprises:

a) a plurality of equilibrating receptacle means provided interiorly of an enclosing side wall, each receptacle means having a surrounding sidewall extending upwardly from a bottom wall to a top edge thereof disposed in a first plane, wherein the surrounding side walls of the plurality of receptacle means have different lengths to provide the plurality of receptacle means with a calculated progression of depths;

b) drop supporting means provided for supporting a drop containing a concentration of the macro-molecular material disposed within each of the plurality of receptacle means, wherein the drop supporting means comprises a support member and a holder means having a cavity for holding the drop containing the macro-molecular material, wherein the support member is provided inside the plurality of receptacle means, disposed along a second plane intermediate the bottom wall of the receptacle means and the first plane, and the support member serves to support the holder means spaced above and in equilibrating communication with the bottom wall of the receptacle means and wherein the support member comprises a perforated plate means supported on a ledge provided along the second plane in the plurality of receptacle means; and c) cover means provided for sealing engagement with the top edge of the sidewall comprising the receptacle means for sealing the receptacle means with each drop supporting means in communication only with the particular receptacle means within which the drop supporting means is disposed.

17. The device of claim 16 wherein the perforated plate means comprises a screen means.

* * * * *